US012336435B2

(12) United States Patent
Park et al.

(10) Patent No.: US 12,336,435 B2
(45) Date of Patent: Jun. 17, 2025

(54) PIEZOLUMINESCENCE STRUCTURE, PIEZOELECTRIC STRUCTURE, MANUFACTURING METHOD THEREOF, AND HIGH SENSITIVITY PRESSURE SENSOR USING THE SAME

(71) Applicant: INDUSTRY-ACADEMIC COOPERATION FOUNDATION, YONSEI UNIVERSITY, Seoul (KR)

(72) Inventors: Hyung Ho Park, Seoul (KR); Kyung Mun Kang, Seoul (KR); Yue Wang, Seoul (KR); Min Jae Kim, Yongin-si (KR); Chabungbam Akendra Singh, Seoul (KR); Chan Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 1051 days.

(21) Appl. No.: 17/337,301

(22) Filed: Jun. 2, 2021

(65) Prior Publication Data

US 2021/0376222 A1  Dec. 2, 2021

(30) Foreign Application Priority Data

Jun. 2, 2020  (KR) .......................... 10-2020-0066654

(51) Int. Cl.
*H01L 41/187* (2006.01)
*C09K 11/55* (2006.01)
(Continued)

(52) U.S. Cl.
CPC .......... *H10N 30/8536* (2023.02); *C09K 11/55* (2013.01); *C23C 16/45525* (2013.01);
(Continued)

(58) Field of Classification Search
CPC .......................... H10N 30/8536; H10N 30/302
(Continued)

(56) References Cited

U.S. PATENT DOCUMENTS

2022/0267606 A1  8/2022  Park et al.

FOREIGN PATENT DOCUMENTS

JP  2001-222913  *  8/2001  ............... H01B 3/00
KR  10-2011-0045732  5/2011
(Continued)

OTHER PUBLICATIONS

U.S. Appl. No. 17/939,555, filed Sep. 7, 2022, by Park et al.
(Continued)

*Primary Examiner* — Derek J Rosenau
(74) *Attorney, Agent, or Firm* — Knobbe, Martens, Olson & Bear, LLP

(57) ABSTRACT

Provided are a piezoluminescence structure, a piezoelectric structure, a manufacturing method thereof, and a high-sensitivity pressure sensor using the same. The piezoelectric structure includes: a plurality of perovskite material layers each including a material having an $A_nB_nO_{3n}$ perovskite structure; and interlayers inserted between the plurality of perovskite material layers and including A*O which is a metal oxide having reaction resistance to $CO_2$. Here, A and A* are different elements and are one of an alkaline earth metal element, an alkali metal element, a lanthanide element, and a post-transition metal element, B is a transition metal element, O is an oxygen element, and n is a positive (+) integer. The piezoelectric structure may be a piezoluminescence structure.

15 Claims, 5 Drawing Sheets

(51) Int. Cl.
    *C23C 16/455*     (2006.01)
    *H10N 30/05*      (2023.01)
    *H10N 30/076*     (2023.01)
    *H10N 30/079*     (2023.01)
    *H10N 30/30*      (2023.01)
    *H10N 30/853*     (2023.01)

(52) U.S. Cl.
    CPC ........... *H10N 30/05* (2023.02); *H10N 30/076* (2023.02); *H10N 30/079* (2023.02); *H10N 30/302* (2023.02)

(58) Field of Classification Search
    USPC ...................... 310/358; 252/62.9 R, 62.9 PZ
    See application file for complete search history.

(56)             References Cited

FOREIGN PATENT DOCUMENTS

KR    10-2017-0003401    1/2017
    KR    10-2019-0119203    10/2019

OTHER PUBLICATIONS

Fan et al., "Piezoluminescence from ferroelectric $Ca_3Ti_2O_7$:Pr3+ long-persistent phosphor," Optics Express (2017) 25(13):14238.
U.S. Appl. No. 17/674,743, filed Feb. 17, 2022, by Cheon et al.
U.S. Appl. No. 17/674,749, filed Feb. 17, 2022, by Cheon et al.
U.S. Appl. No. 17/674,753, filed Feb. 17, 2022, by Cheon et al.

* cited by examiner

○ : A atom
○ : B atom
● : oxygen atom

PIEZOLUMINESCENCE STRUCTURE, PIEZOELECTRIC STRUCTURE, MANUFACTURING METHOD THEREOF, AND HIGH SENSITIVITY PRESSURE SENSOR USING THE SAME

CROSS REFERENCE TO RELATED APPLICATION

The present application claims priority to Korean Patent Application No. 10-2020-0066654 filed on Jun. 2, 2020. The entire contents of each of the above-listed applications are hereby incorporated by reference for all purposes.

TECHNICAL FIELD

The following disclosure relates to a piezoelectric material and an application thereof, and to a piezoluminescence structure, a piezoelectric structure, a manufacturing method thereof, and a high-sensitivity pressure sensor using the same.

BACKGROUND

In general, a piezoelectric pressure sensor using a piezoelectric material operates on the basis of the piezoelectric effect of generating an electrical signal by structural deformation of the piezoelectric material by a pressure applied to the piezoelectric material. The pressure applied from the outside to the piezoelectric material induces a structural distortion in the piezoelectric material, and a band bending phenomenon occurs from asymmetry of a structure due to the structural distortion, thereby generating a piezoelectric field. The piezoelectric field changed by the pressure may be output and sensed as an electrical signal (for example, a current or a voltage). However, the piezoelectric pressure sensor requires a complicated structure including upper and lower electrodes, a circuit and an electrical signal detector, and a high driving pressure (GPa or MPa level). In order to meet requirements of the next-generation pressure sensor, a structure of the pressure sensor should be simple and the pressure sensor should sense a small change in pressure by improvement of sensitivity. Therefore, a new pressure sensor using a material and a driving manner different from those of the pressure sensor according to the related art is required.

Recently, it has been reported that perovskite materials such as $CsPbBr_3$, $(MA)PbBr_3Cl_3I_3$ (MA methylammonium), and $(FA)PbBr_3$ (FA formamidinium) show a unique color luminescence phenomenon according to a pressure or show a change in color intensity according to a pressure change. As described above, a material whose luminescence characteristics change according to pressure is called a piezoluminescence material. In these materials, it is theoretically possible to change to another color according to a change in pressure, but to this end, it is required to apply a large pressure of several GPa or more (a pressure of about 1 to 40 GPa depending on a material). In addition, since a wavelength change range in the color change is small, which is within about 100 nm, it may be practically difficult to perform a function as a sensor that measures a pressure according to the color change. That is, since a pressure value of a GPa level is excessive large, such a pressure value may not be used in daily life, and since a change in a wavelength generating the color change is slight, an application of these materials to the pressure sensor may be limited.

Therefore, it is required to develop a new piezoluminescence material of which luminescence characteristics (for example, a luminescence color) may be significantly changed even with a small pressure. In addition, in developing such a piezoluminescence material, structural/physical stability needs to be secured.

SUMMARY

An embodiment of the present disclosure is directed to providing a piezoluminescence structure/piezoelectric structure of which luminescence characteristics may be significantly changed even with a low driving pressure and which have structurally/physically excellent stability in the atmosphere.

Another embodiment of the present disclosure is directed to providing a manufacturing method of the piezoluminescence structure/piezoelectric structure described above.

Still another embodiment of the present disclosure is directed to providing an element/device (for example, a high-sensitivity pressure sensor) that includes the piezoluminescence structure/piezoelectric structure described above.

Embodiments of the present disclosure are not limited to the embodiments mentioned above, and other embodiments that are not mentioned may be understood by those skilled in the art from the following description.

In one general aspect, a piezoelectric structure includes: a plurality of perovskite material layers each including a material having an $A_nB_nO_{3n}$ perovskite structure; and interlayers inserted between the plurality of perovskite material layers and including A*O which is a metal oxide having reaction resistance to $CO_2$, wherein A and A* are different elements and are one of an alkaline earth metal element, an alkali metal element, a lanthanide element, and a post-transition metal element, B is a transition metal element, O is an oxygen element, and n is a positive (+) integer.

The reaction resistance of A*O to $CO_2$ may be higher than reaction resistance of BaO to $CO_2$.

A*O having the reaction resistance to $CO_2$ may include, for example, one of SrO and CaO.

The material having the $A_nB_nO_{3n}$ perovskite structure may have a lattice parameter within a range of ±20% of a lattice parameter of A*O.

The material having the $A_nB_nO_{3n}$ perovskite structure may include, for example, any one of $BaTiO_3$, $SrIrO_3$, $NaNbO_3$, and $KNbO_3$.

The perovskite material layers and the interlayers may be alternately stacked two times or more.

The interlayer may be a monolayer of A*O or have a structure in which the monolayer is stacked plural times within ten layers.

The piezoelectric structure may include a compound represented by the following Chemical Formula by a combination of the material having the $A_nB_nO_{3n}$ perovskite structure and A*O, and the compound may have reaction resistance to $CO_2$.

Chemical Formula: $(AA^*)_{n+1}B_nO_{3n+1}$

Wherein A and A* are different elements and are one of an alkaline earth metal element, an alkali metal element, a lanthanide element, and a post-transition metal element, B is a transition metal element, O is an oxygen element, and n is a positive (+) integer.

The piezoelectric structure may further include a dopant included in at least one of the perovskite material layer and the interlayer, wherein the dopant includes a rare earth element or a transition metal element.

The rare earth element of the dopant may include, for example, at least one of Sm, Eu, Gd, Yb, Pr, Tm, and Er.

The transition metal element of the dopant may include, for example, at least one of Mn, Cu, Nb, and Co.

The piezoelectric structure may be a piezoluminescence structure.

A driving pressure and a luminescence intensity of the piezoelectric structure may be adjusted by the number and/or a content of interlayers.

A luminescence color and a luminescence intensity of the piezoelectric structure may be adjusted by a trap site formed in the piezoelectric structure.

In another general aspect, a piezoluminescence sensor includes the piezoelectric structure described above.

In still another general aspect, a display device includes the piezoelectric structure described above.

In yet still another general aspect, a manufacturing method of a piezoelectric structure includes: forming a perovskite material layer including a material having an $A_nB_nO_{3n}$ perovskite structure; and forming an interlayer on the perovskite material layer, the interlayer including A*O which is a metal oxide having reaction resistance to $CO_2$, wherein the forming of the perovskite material layer and the forming of the interlayer are repeatedly performed to form a structure in which the interlayers are inserted between a plurality of perovskite material layers, and A and A* are different elements and are one of an alkaline earth metal element, an alkali metal element, a lanthanide element, and a post-transition metal element, B is a transition metal element, O is an oxygen element, and n is a positive (+) integer.

The forming of the perovskite material layer and the forming of the interlayer may be performed by an atomic layer deposition (ALD) method, a chemical vapor deposition (CVD) method, or a physical vapor deposition (PVD) method.

The forming of the perovskite material layer and the forming of the interlayer may be performed by the atomic layer deposition (ALD) method.

A*O having the reaction resistance to $CO_2$ may include, for example, one of SrO and CaO.

The material having the $A_nB_nO_{3n}$ perovskite structure may have a lattice parameter within a range of ±20% of a lattice parameter of A*O.

The material having the $A_nB_nO_{3n}$ perovskite structure may include, for example, any one of $BaTiO_3$, $SrIrO_3$, $NaNbO_3$, and $KNbO_3$.

The piezoelectric structure may include a compound represented by the following Chemical Formula by a combination of the material having the $A_nB_nO_{3n}$ perovskite structure and A*O, and the compound may have reaction resistance to $CO_2$, Chemical Formula: $(AA^*)_{n+1}B_nO_{3n+1}$ Wherein A and A* are different elements and are one of an alkaline earth metal element, an alkali metal element, a lanthanide element, and a post-transition metal element, B is a transition metal element, O is an oxygen element, and n is a positive (+) integer.

At least one of the perovskite material layer and the interlayer may be formed to further include a dopant.

The piezoelectric structure may be a piezoluminescence structure.

Figure 1:
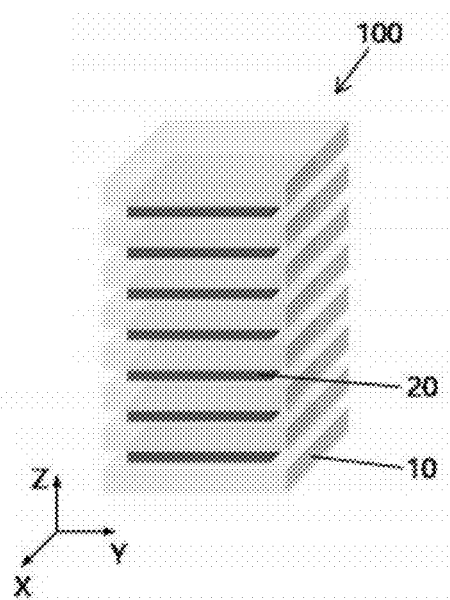
FIG. 1 is a perspective view exemplarily illustrating a piezoelectric structure according to an embodiment of the present disclosure.

DETAILED DESCRIPTION OF MAIN ELEMENTS 5a, 5b: dopant
10, 10a, 10b, 10c: perovskite material layer
20, 20a, 20b: interlayer
100, 100a, 100b: piezoelectric structure

DETAILED DESCRIPTION

Hereinafter, embodiments of the present disclosure will be described in detail with reference to the accompanying drawings.

Embodiments of the present disclosure to be described below will be provided only in order to more clearly describe the present disclosure to those skilled in the art, the scope of the present disclosure is not limited to the following embodiments, and the following embodiments may be modified into several other forms.

Terms used in the present specification are used in order to describe a specific embodiment, are not to limit the present disclosure. A singular form used in the present specification may include plural forms unless explicitly described otherwise. In addition, terms "comprise" and/or "comprising" used in the present specification specify the presence of stated shapes, steps, numerals, operations, members, elements, and/or groups thereof, but do not preclude the presence or the addition of one or more other shapes, steps, numerals, operations, members, elements, and/or groups thereof. In addition, a term "connection" used in the present specification is a concept including not only a direction connection between any members, but also an indirect connection between any members with the other member interposed therebetween.

In addition, in the present specification, when any member is referred to as being positioned "on" another member, it includes not only a case in which any member and another member are in contact with each other, but also a case in which the other member is interposed between any member and another member. A term "and/or" used in the present disclosure includes any one of corresponding enumerated items and all combinations of one or more of the corresponding enumerated items. In addition, terms indicating degrees such as "about" and "substantially" used in the present specification are used in a category of numeral values or degrees or the meaning close thereto in consideration of inherent manufacturing and material tolerances, and are used in order to prevent an infringer from making improper use of disclosure contents in which exact or absolute numbers provided to assist in understanding of the present application are mentioned.

Hereinafter, embodiments of the present disclosure will be described in detail with reference to the accompanying drawings. Sizes or thicknesses of the regions or parts illustrated in the accompanying drawings may be slightly exaggerated for clarity of the specification and convenience of explanation. Like reference numerals denote like components throughout a detailed description.

FIG. 1 is a perspective view exemplarily illustrating a piezoelectric structure 100 according to an embodiment of the present disclosure. The piezoelectric structure 100 according to the present embodiment may be a 'piezoelectric material', and the piezoelectric material may be a 'piezoluminescence material (structure)'.

Referring to FIG. 1, the piezoelectric structure 100 may include a plurality of perovskite material layers 10 and interlayers 20 inserted between the plurality of perovskite material layers 10. The plurality of perovskite material layers 10 may be stacked in a thickness direction (that is, a Z-axis direction in FIG. 1), and the interlayer 20 may be inserted between the plurality of perovskite material layers 10. The perovskite material layers 10 and the interlayers 20 may be alternately stacked two times or more. For example, two or more perovskite material layers 10 may be provided, and each of the interlayers 20 may be provided between the two or more perovskite material layers 10. Such a piezoelectric structure 100 may be said to have a superlattice perovskite structure in which the interlayers 20 are inserted.

Figure 2:
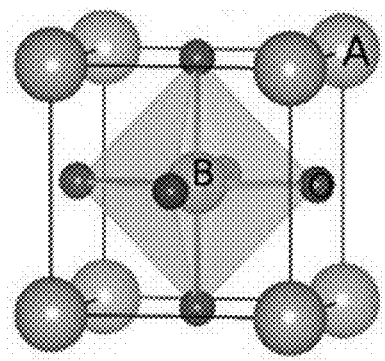
FIG. 2 is a view illustrating an $A_nB_nO_{3n}$ perovskite structure that may be applied to a perovskite material layer of the piezoelectric structure according to an embodiment of the present disclosure.

The perovskite material layer 10 may include a material having an $A_nB_nO_{3n}$ perovskite structure. The perovskite material layer 10 may be formed of the material having the $A_nB_nO_{3n}$ perovskite structure. Here, A may be one of an alkaline earth metal element, an alkali metal element, a lanthanide element, and a post-transition metal element, B may be a transition metal element, O may be an oxygen element, and n may be a positive (+) integer, n may be an integer in the range from 1 to 10000. For example, in a case where n is 1, $A_nB_nO_{3n}$ is $ABO_3$, and in a case where n is 2, $A_nB_nO_{3n}$ is $A_2B_2O_6$. A crystal structure of the material having the $A_nB_nO_{3n}$ perovskite structure may be, for example, as illustrated in FIG. 2. That is, FIG. 2 illustrates the $A_nB_nO_{3n}$ perovskite structure that may be applied to the perovskite material layer 10 of the piezoelectric structure 100.

Referring to FIG. 2, the $A_nB_nO_{3n}$ perovskite structure may have a cubic structure. A unit of the $A_nB_nO_{3n}$ perovskite structure may have a crystal structure in which one B atom is disposed at a body center of the cubic structure, six oxygen (O) atoms are disposed at face centers of the cubic structure, and eight A atoms are disposed at corners of the cubic structure. Here, the $A_nB_nO_{3n}$ perovskite structure may be said to be formed of an AO layer (or an $A_{0.5}O_{0.5}$ layer) and a $B_2O_4$ layer (or a $BO_2$ layer) separated by atomic layer units. The $A_nB_nO_{3n}$ perovskite structure illustrated in FIG. 2 may be considered as $ABO_3$ structure.

Referring to FIG. 1 again, the interlayer 20 may include A*O, which is a metal oxide having reaction resistance to $CO_2$. Here, A* may be one of an alkaline earth metal element, an alkali metal element, a lanthanide element, and a post-transition metal element, and O is an oxygen element. A* may be an element different from A of $A_nB_nO_{3n}$ of the perovskite material layer 10. That is, A and A* are different elements, and may be one of an alkaline earth metal element, an alkali metal element, a lanthanide element, and a post-transition metal element. Each of the interlayers 20 may be a monolayer of A*O or may have a structure in which the monolayer is stacked plural times within ten layers or within five layers.

The meaning that A*O, that is, that the metal oxide has reaction resistance to $CO_2$ may be that A*O does not react well with $CO_2$. In regard to a reaction with $CO_2$, even though the amount of change in a Gibbs' free energy ($\Delta G$) of A*O has a negative (−) value, a relatively high energy barrier, that is, an activation barrier exists, and it may thus be said that A*O itself does not cause a carbonate formation reaction well. Therefore, even though the amount of change in the Gibbs's free energy ($\Delta G$) has the negative (−) value, it may be considered that A*O has the reaction resistance to $CO_2$.

The reaction resistance of A*O to $CO_2$ may be higher than reaction resistance of BaO to $CO_2$. In other words, A*O may be a material that does not react well with $CO_2$ as compared with BaO. That is, A*O may be a material that does not cause a carbonate formation reaction well as compared with BaO. As a specific example, A*O may include one of SrO and CaO. Accordingly, each of the interlayers 20 may include SrO or CaO as A*O.

In addition, A*O may have a crystal structure, and may have a lattice mismatch with the material having the $A_nB_nO_{3n}$ perovskite structure (hereinafter, referred to as an $A_nB_nO_{3n}$ material) to some extent. In other words, the perovskite material layer 10 and the interlayer 20 may have some degree of lattice mismatch characteristics on a bonded interface between the perovskite material layer 10 and the interlayer 20. In this regard, the $A_nB_nO_{3n}$ material may have a lattice parameter within the range of about ±20% of a lattice parameter of A*O. More specifically, since lattice parameters of SrO and CaO that may be used as A*O are about 5.1 Å and about 4.8 Å, respectively, the $A_nB_nO_{3n}$ material may be a perovskite-based piezoelectric material having a lattice parameter of about 3.8 to 6.1 Å. Here, the lattice parameter of the $A_nB_nO_{3n}$ material may correspond to a lattice parameter of the AO layer on a bonded surface bonded to A*O, that is, an A-O interatomic distance. As a specific example, the $A_nB_nO_{3n}$ material may include any one of $BaTiO_3$, $SrIrO_3$, $NaNbO_3$, and $KNbO_3$. Here, a corresponding lattice parameter of $BaTiO_3$ is about 5.7 Å, a corresponding lattice parameter of $NaNbO_3$ is about 3.9 Å, and a corresponding lattice parameter of $KNbO_3$ is about 4.0 Å. In addition to $BaTiO_3$, $SrIrO_3$, $NaNbO_3$, and $KNbO_3$, a perovskite-based piezoelectric material satisfying the condition described above may be used as the $A_nB_nO_{3n}$ material.

The piezoelectric structure 100 according to the present embodiment may include a compound represented by the following Chemical Formula 1 by a combination of the $A_nB_nO_{3n}$ material and A*O.

$(AA^*)_{n+1}B_nO_{3n+1}$       [Chemical Formula 1]:

In Chemical Formula 1, A and A* may be different elements, A may be one of an alkaline earth metal element, an alkali metal element, a lanthanide element, and a post-transition metal element, B may be a transition metal element, O may be an oxygen element, and n may be a positive (+) integer, n may be an integer in the range from 1 to 10000. The compound $(AA^*)_{n+1}B_nO_{3n+1}$ may be said to be formed by the insertion of A*O, that is, the insertion of the interlayer 20. The compound may have reaction resistance to $CO_2$. In other words, the compound may not react with $CO_2$ or may not substantially react with $CO_2$.

In an embodiment of the present disclosure, some degree of lattice mismatch may exist between A*O and the $A_nB_nO_{3n}$ material. In other words, some degree of lattice mismatch may exist between the perovskite material layer 10 and the interlayer 20. In addition, the compound represented by $(AA^*)_{n+1}B_nO_{3n+1}$ may be formed by the insertion of the interlayer 20. The lattice mismatch and the formation of the compound $(AA^*)_{n+1}B_nO_{3n+1}$ described above may serve to dramatically increase luminous efficiency of a piezoluminescence material and significantly decrease a driving pressure.

By making an $(AA^*)_{n+1}B_nO_{3n+1}$ compound through insertion of an A*O layer into the $A_nB_nO_{3n}$ perovskite structure, a local structural change (distortion) due to a difference in atomic size is induced, and an effect of increasing lattice defects through the induced structural change (distortion) may be obtained. Such increased lattice defects may be an important factor acting as traps of electrons and holes in piezoluminescence to increase a piezo-constant. Therefore, by inserting the A*O layer into the $A_nB_nO_{3n}$ perovskite structure, luminous efficiency of a piezoluminescence material based on a perovskite material may be dramatically increased. In addition, since the lattice mismatch may exist between the perovskite material layer 10 and the interlayer 20, a strain may be induced in the perovskite material layer 10 by the interlayer 20, and such a strain may act as an internal force. In a state in which such an internal force is applied, an additional force (that is, an external force) may be applied from the outside to the piezoelectric structure 100 to induce piezoluminescence driving of the piezoelectric structure 100. In this case, an effect of significantly decreasing a driving pressure of piezoluminescence may be obtained. A high-efficiency and high-sensitivity piezoluminescence material with a low driving pressure may be implemented by such a mechanism.

A conventional piezoluminescence material operates on the principle that a piezoelectric field is generated by structural deformation due to the application of an external pressure to the piezoluminescence material, electrons existing in a trap move to a conduction band as a result of a band bending phenomenon by the piezoelectric field, and energy is released by a recombination of electrons and holes. Since such a conventional piezoluminescence material requires a very high driving pressure and has low efficiency and sensitivity, it may be difficult to apply such a conventional piezoluminescence material to an actual sensor. However, according to an embodiment of the present disclosure, a piezoluminescence material that may be driven at a low pressure and has high efficiency and sensitivity may be implemented by the configuration and the mechanism described above.

In addition, the piezoelectric structure 100 according to an embodiment of the present disclosure may have structurally/physically excellent stability in the atmosphere. This may be related to the use of the interlayer 20 including A*O having the reaction resistance to $CO_2$. This will be described in more detail below.

In a case where a BaO material is used as an insertion layer (interlayer) material in a $BaTiO_3$ material, $Ba_2TiO_4$ may be formed by a combination of $BaTiO_3$ and BaO, and $Ba_2TiO_4$ may serve to increase luminous efficiency. However, $Ba_2TiO_4$ easily reacts with $CO_2$ in the atmosphere, and it is thus difficult for a $Ba_2TiO_4$ structure increasing the luminous efficiency to be maintained. That is, $Ba_2TiO_4$ may react with $CO_2$ to form $BaTiO_3$ and $BaCO_3$ (that is, Ba carbonate). Therefore, in a case where the BaO material is used as the insertion layer (interlayer) material in the $BaTiO_3$ material, it may be difficult to implement a high-efficiency/high-sensitivity piezoluminescence material.

However, in a case where the interlayer 20 including A*O having the reaction resistance to $CO_2$ is used as in an embodiment of the present disclosure, a high-efficiency/high-sensitivity piezoluminescence material having structurally/physically excellent stability in the atmosphere may be implemented. For example, in a case where a SrO material is used as an insertion layer (interlayer) material in the $BaTiO_3$ material, $(BaSr)TiO_4$ may be formed by a combination of $BaTiO_3$ and SrO, and $(BaSr)TiO_4$ may serve to increase luminous efficiency. Since $(BaSr)TiO_4$ has a reaction resistance that does not react with $CO_2$ in the atmosphere, a $(BaSr)TiO_4$ structure increasing the luminous efficiency may be stably maintained in the atmosphere. $(BaSr)TiO_4$ may include $SrTiO_3$ in a structure thereof, and $SrTiO_3$ may also have reaction resistance to $CO_2$. As another example, in a case where a CaO material is used as an insertion layer (interlayer) material in the $BaTiO_3$ material, $(BaCa)TiO_4$ may be formed by a combination of $BaTiO_3$ and CaO. Here, $(BaCa)TiO_4$ may have reaction resistance to $CO_2$, and a $(BaCa)TiO_4$ structure may be stably maintained in the atmosphere. Therefore, according to an embodiment of the present disclosure, a piezoluminescence material-based high-sensitivity piezoelectric element (for example, piezoelectric sensor) capable of maximizing luminous efficiency may be implemented without additional capsulation even in the atmosphere.

In a case where an A'O material that does not have the reaction resistance to $CO_2$ is used as an interlayer material in the $A_nB_nO_{3n}$ material, a carbonate reaction may occur according to the following Chemical Formula 2. Here, A and A' are the same or different elements and are one of an alkaline earth metal element, an alkali metal element, a lanthanide element, and a post-transition metal element, B is a transition metal element, O is an oxygen element, and n is a positive (+) integer.

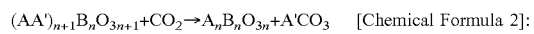

$(AA')_{n+1}B_nO_{3n+1}+CO_2 \rightarrow A_nB_nO_{3n}+A'CO_3$  [Chemical Formula 2]:

According to an embodiment of the present disclosure, the interlayer 20 including A*O having the reaction resistance to $CO_2$ is used, and it is thus possible to prevent the carbonate reaction as in Chemical Formula 2 from occurring. In other words, the $(AA^*)_{n+1}B_nO_{3n+1}$ compound described in Chemical Formula 1 has the reaction resistance to $CO_2$ in the atmosphere, and may thus have structurally/physically excellent stability.

Figure 3:
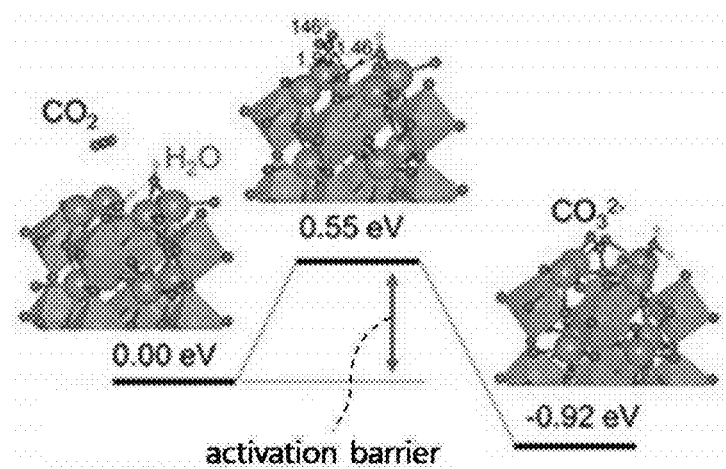
FIG. 3 is a schematic view of a carbonate formation reaction of SrO that may be applied as an interlayer material of the piezoelectric structure according to an embodiment of the present disclosure.

FIG. 3 is a schematic view of a carbonate formation reaction of SrO that may be applied as an interlayer material of the piezoelectric structure according to an embodiment of the present disclosure.

Referring to FIG. 3, in regard to a reaction with $CO_2$, even though the change in a Gibbs' free energy (ΔG) of SrO has a negative (−) value (that is, −0.92 eV), a relatively high energy barrier, that is, an activation barrier should be overcome for the reaction, and it may thus be said that SrO does not cause a carbonate formation reaction in a normal atmosphere. In terms of this, even though the change in the Gibbs's free energy (ΔG) has the negative (−) value, it may be considered that SrO has the reaction resistance to $CO_2$.

Figure 4:
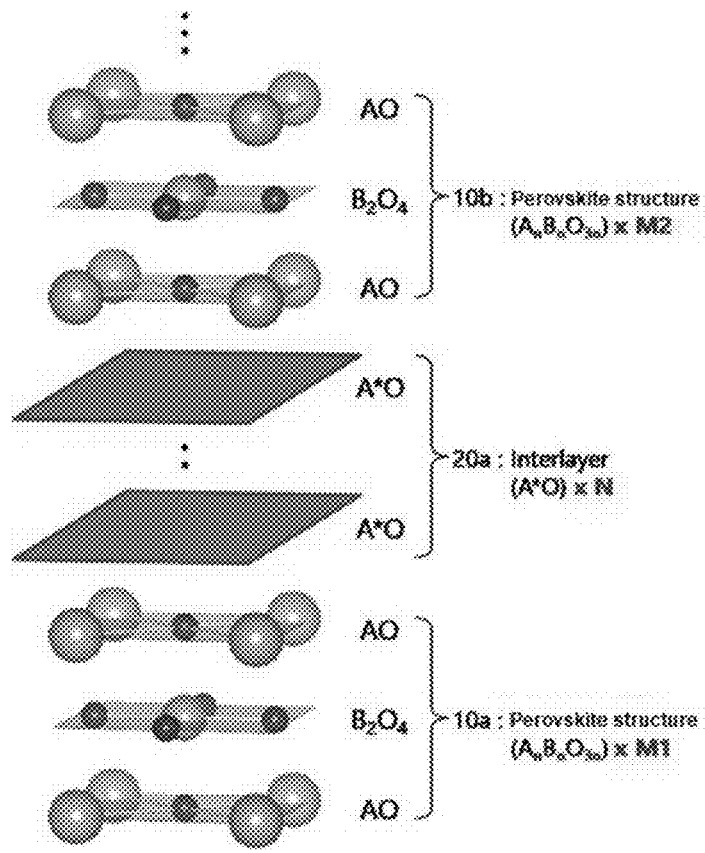
FIG. 4 is a view three-dimensionally illustrating crystal structures of perovskite material layers constituting the piezoelectric structure according to an embodiment of the present disclosure and an interlayer inserted between the perovskite material layers.

FIG. 4 is a view three-dimensionally illustrating crystal structures of perovskite material layers 10a and 10b constituting the piezoelectric structure according to an embodiment of the present disclosure and an interlayer 20a inserted between the perovskite material layers.

Referring to FIG. 4, an interlayer 20a may be inserted between a first perovskite material layer 10a and a second perovskite material layer 10b. The first perovskite material layer 10a may have an $A_nB_nO_{3n}$ perovskite structure. In this case, it may be said that the first perovskite material layer 10a is separated into atomic layer units to include a lower AO layer (or $A_{0.5}O_{0.5}$ layer), a $B_2O_4$ layer (or $BO_2$ layer), and an upper AO layer (or $A_{0.5}O_{0.5}$ layer). The first perovskite material layer 10a may have an $ABO_3$ structure. The first perovskite material layer 10a may have a structure in which basic units of the $ABO_3$ structure are repeatedly stacked M1 times. M1 is a positive integer of 1 or more. The second perovskite material layer 10b may have a structure corresponding to that of the first perovskite material layer 10a. In this case, the second perovskite material layer 10b may have a structure in which basic units of the $ABO_3$ structure are repeatedly stacked M2 times. M2 is a positive integer of 1 or more, and may be the same as or different from M1.

The interlayer 20a may include A*O, which is a metal oxide having reaction resistance to $CO_2$. The interlayer 20a may have a structure in which A*O layers are repeatedly stacked N times. Here, N is a positive integer of 1 or more. For example, each of the interlayers 20a may be a monolayer of A*O or may have a structure in which the monolayer is stacked plural times within ten layers or within five layers. A strain may be induced between the A*O layer of the interlayer 20a and the AO layer of the first perovskite material layer 10a due to a lattice mismatch between the A*O layer of the interlayer 20a and the AO layer of the first perovskite material layer 10a in contact with the A*O layer of the interlayer 20a. In addition, a strain may be induced between the A*O layer of the interlayer 20a and the AO layer of the second perovskite material layer 10b due to a lattice mismatch between the A*O layer of the interlayer 20a and the AO layer of the second perovskite material layer 10b in contact with the A*O layer of the interlayer 20a. In addition, $(AA^*)_{n+1}B_nO_{3n+1}$ compounds may be formed at bonded portions between the first and second perovskite material layers 10a and 10b and the interlayer 20a by the insertion of the interlayer 20a.

Meanwhile, the interlayer 20a is illustrated as a simple planar structure without atomic arrangement in FIG. 4, but the interlayer 20a may have a structure in which A* atoms are disposed at four corners and an oxygen (O) atom is disposed at the center or a structure in which oxygen (O) atoms are disposed at four corners and A* atom is disposed at the center.

The piezoelectric structure of FIG. 4 may be said to have a superlattice perovskite structure in which the interlayer 20 is inserted.

According to another embodiment of the present disclosure, at least one of the perovskite material layer 10 and the interlayer 20 in the piezoelectric structure 100 of FIG. 1 may further include a dopant. In this case, the dopant may include a rare earth element or a transition metal element. The rare earth element of the dopant may include, for example, at least one of Sm, Eu, Gd, Yb, Pr, Tm, and Er. The transition metal element of the dopant may include, for example, at least one of Mn, Cu, Nb, and Co. However, specific materials of the dopant are not limited to those described above, and may also be other materials.

Figure 5:
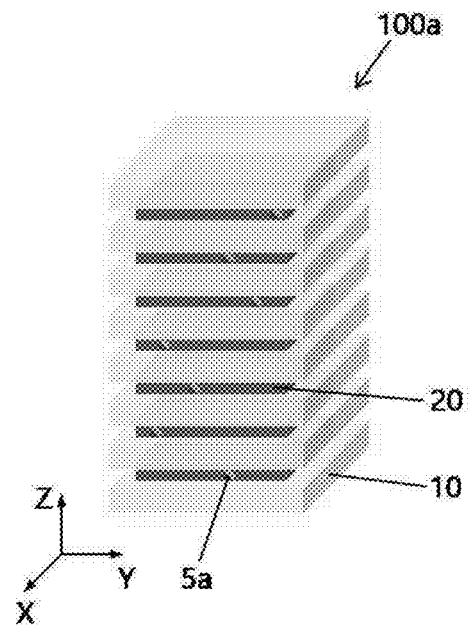
FIG. 5 is a perspective view illustrating a piezoelectric structure according to another embodiment of the present disclosure.

FIG. 5 illustrates a case in which the interlayer 20 further includes a dopant 5a in the piezoelectric structure 100 of FIG. 1. The piezoelectric structure of FIG. 5 is denoted by reference numeral 100a.

Figure 6:
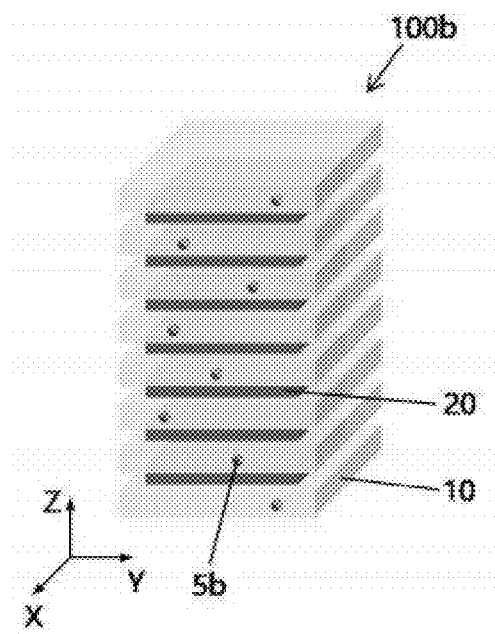
FIG. 6 is a perspective view illustrating a piezoelectric structure according to another embodiment of the present disclosure.

FIG. 6 illustrates a case in which the perovskite material layer 10 further includes a dopant 5b in the piezoelectric structure 100 of FIG. 1. The piezoelectric structure of FIG. 6 is denoted by reference numeral 100b.

Although not illustrated here, according to another embodiment, the piezoelectric structure may also have a configuration in which both of the perovskite material layer 10 and the interlayer 20 may include dopants. In this case, a dopant doped in the perovskite material layer 10 and a dopant doped in the interlayer 20 may be the same material or different materials.

As in embodiments of FIGS. 5 and 6, a bandgap in which luminescence occurs may be adjusted by creating a trap site in the piezoelectric structure 100 using the rare earth element, the transition metal element, or the like, as the dopants 5a and 5b. Through this, an efficient piezoluminescence element having color variability may be implemented by adjusting luminescence color and intensity.

The piezoelectric structures 100, 100a, and 100b according to embodiments described with reference to FIGS. 1 to 6 may be piezoluminescence structures. A driving pressure and a luminescence intensity of the piezoelectric structures 100, 100a, and 100b may be adjusted by the number and/or a content of interlayers 20. In addition, a luminescence color and a luminescence intensity of the piezoelectric structures 100, 100a, and 100b may be adjusted by the trap site formed in the piezoelectric structures 100, 100a, and 100b. Therefore, according to an embodiment of the present disclosure, a high-sensitivity and high-efficiency element capable of easily inducing a change (significant change) in luminescence characteristics (for example, luminescence wavelength/luminescence color) even with a low driving voltage and a small pressure may be implemented. In addition, according to an embodiment of the present disclosure, as described above, a piezoelectric structure element that may have structurally/physically excellent stability in the atmosphere may be implemented.

Next, a manufacturing method of a piezoelectric structure according to an embodiment of the present disclosure will be described. Here, the piezoelectric structure may be a piezoelectric material, and the piezoelectric material may be a piezoluminescence material.

The manufacturing method of a piezoelectric structure according to an embodiment of the present disclosure may include forming a perovskite material layer including a material having an $A_nB_nO_{3n}$ perovskite structure; and forming an interlayer on the perovskite material layer, the interlayer including A*O which is a metal oxide having reaction resistance to $CO_2$, wherein the forming of the perovskite material layer and the forming of the interlayer are repeatedly performed to form a structure in which the interlayers are inserted between a plurality of perovskite material layers. For example, a structure in which the interlayer is inserted between two or more perovskite material layers may be formed. The interlayer may be a monolayer of A*O or may have a structure in which the monolayer is stacked plural times. Here, A and A* are different elements, and may be one of an alkaline earth metal element, an alkali metal element, a lanthanide element, and a post-transition metal element, B may be a transition metal element, O may be an oxygen element, and n may be a positive (+) integer.

The forming of the perovskite material layer and the forming of the interlayer may be performed by an atomic layer deposition (ALD) method, a chemical vapor deposition (CVD) method, or a physical vapor deposition (PVD) method. Alternatively, the forming of the perovskite material layer and the forming of the interlayer may be performed by a molecular beam epitaxy (MBE) method or a pulsed laser deposition (PLD) method. As an example, the forming of the perovskite material layer and the forming of the interlayer may be performed by the atomic layer deposition (ALD) method.

A*O having the reaction resistance to $CO_2$ may include, for example, one of SrO and CaO. The material having the $A_nB_nO_{3n}$ perovskite structure (hereinafter, referred to as a $A_nB_nO_{3n}$ material) may have a lattice parameter within the range of about ±20% of a lattice parameter of A*O. More specifically, since lattice parameters of SrO and CaO that may be used as A*O are about 5.1 Å and about 4.8 Å, respectively, the $A_nB_nO_{3n}$ material may be a perovskite-based piezoelectric material having a lattice parameter of about 3.8 to 6.1 Å. Here, the lattice parameter of the $A_nB_nO_{3n}$ material may correspond to a lattice parameter of the AO layer on a bonded surface bonded to A*O, that is, an A-O interatomic distance. As a specific example, the $A_nB_nO_{3n}$ material may include any one of $BaTiO_3$, $SrIrO_3$, $NaNbO_3$, and $KNbO_3$. Here, a corresponding lattice parameter of $BaTiO_3$ is about 5.7 Å, a corresponding lattice parameter of $NaNbO_3$ is about 3.9 Å, and a corresponding lattice parameter of $KNbO_3$ is about 4.0 Å. In addition to $BaTiO_3$, $SrIrO_3$, $NaNbO_3$, and $KNbO_3$, a perovskite-based piezoelectric material satisfying the condition described above may be used as the $A_nB_nO_{3n}$ material.

The piezoelectric structure may be formed to include a compound represented by Chemical Formula: $(AA^*)_{n+1}B_nO_{3n+1}$ by a combination of the $A_nB_nO_{3n}$ material and A*O. The compound may have reaction resistance to $CO_2$. Here, A and A* are different elements and may be one of an alkaline earth metal element, an alkali metal element, a lanthanide element, and a post-transition metal element, B may be a transition metal element, O may be an oxygen element, and n may be a positive (+) integer.

In addition, in the manufacturing method of a piezoelectric structure according to an embodiment, at least one of the perovskite material layer and the interlayer may be formed to further include a dopant. The dopant may include a rare earth element or a transition metal element. The rare earth element of the dopant may include, for example, at least one of Sm, Eu, Gd, Yb, Pr, Tm, and Er. The transition metal element of the dopant may include, for example, at least one of Mn, Cu, Nb, and Co. However, specific materials of the dopant are not limited to those described above, and may also be other materials.

Figure 7:
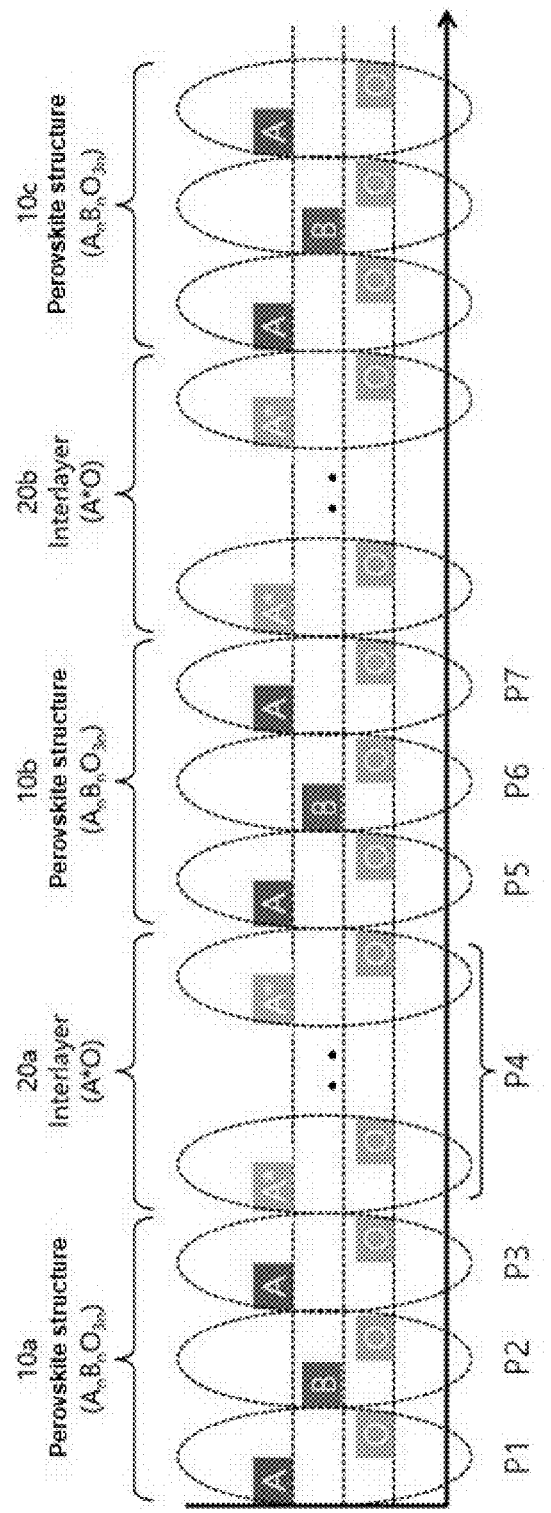
FIGS. 7 and 8 are views for describing a manufacturing method of a piezoelectric structure according to an embodiment of the present disclosure.

FIG. 7 is a view for describing a manufacturing method of a piezoelectric structure according to an embodiment of the present disclosure. The present embodiment exemplarily illustrates a manufacturing method of a piezoelectric structure using an atomic layer deposition (ALD) method.

Referring to FIG. 7, a source including element A (source A), a source including element A* (source A*), a source including element B (source B), and a source including oxygen (O) (source O) may be supplied into a chamber (not illustrated) for manufacturing the piezoelectric structure according to a predetermined order. The piezoelectric structure may include a plurality of perovskite material layers 10a, 10b, and 10c and interlayers 20a and 20b inserted between the plurality of perovskite material layers 10a, 10b, and 10c. A step of forming a first perovskite material layer 10a may include, for example, a step of sequentially supplying the source A, the source O, the source B, the source O, the source A, and the source O to the chamber. In the step of forming the first perovskite material layer 10a, the supply of the source A, the source O, the source B, the source O, the source A, and the source O may be used as a basic unit and the basic unit may be repeatedly performed plural times.

A step of forming a first interlayer 20a may include, for example, a step of sequentially supplying the source A* and the source O to the chamber, and the supply of the source A* and the source O may be used as a basic unit and the basic unit may be repeatedly performed plural times. For example, the basic unit may be repeatedly performed about 10 times or less or about 5 times or less. Therefore, the first interlayer 20a may be a monolayer of A*O or may have a configuration in which the monolayer is repeatedly stacked plural times.

A forming method of second and third perovskite material layers 10b and 10c may be similar to or the same as the forming method of the first perovskite material layer 10a, and a forming method of a second interlayer 20b may be similar to or the same as the forming method of the first interlayer 20a. The numbers of times by which the basic structure is repeatedly stacked in the plurality of perovskite material layers 10a, 10b, and 10c may be the same as or different from each other. In addition, the numbers of times by which the basic structure is repeatedly stacked in a plurality of interlayers 20a and 20b may be the same as or different from each other.

The perovskite material layers 10a, 10b, and 10c and the interlayers 20a and 20b may have some degree of lattice mismatch therebetween, but since a degree of the lattice mismatch is not large, epitaxial crystal growth may be possible, and as a crystal grows, a strain may be induced.

Figure 8:
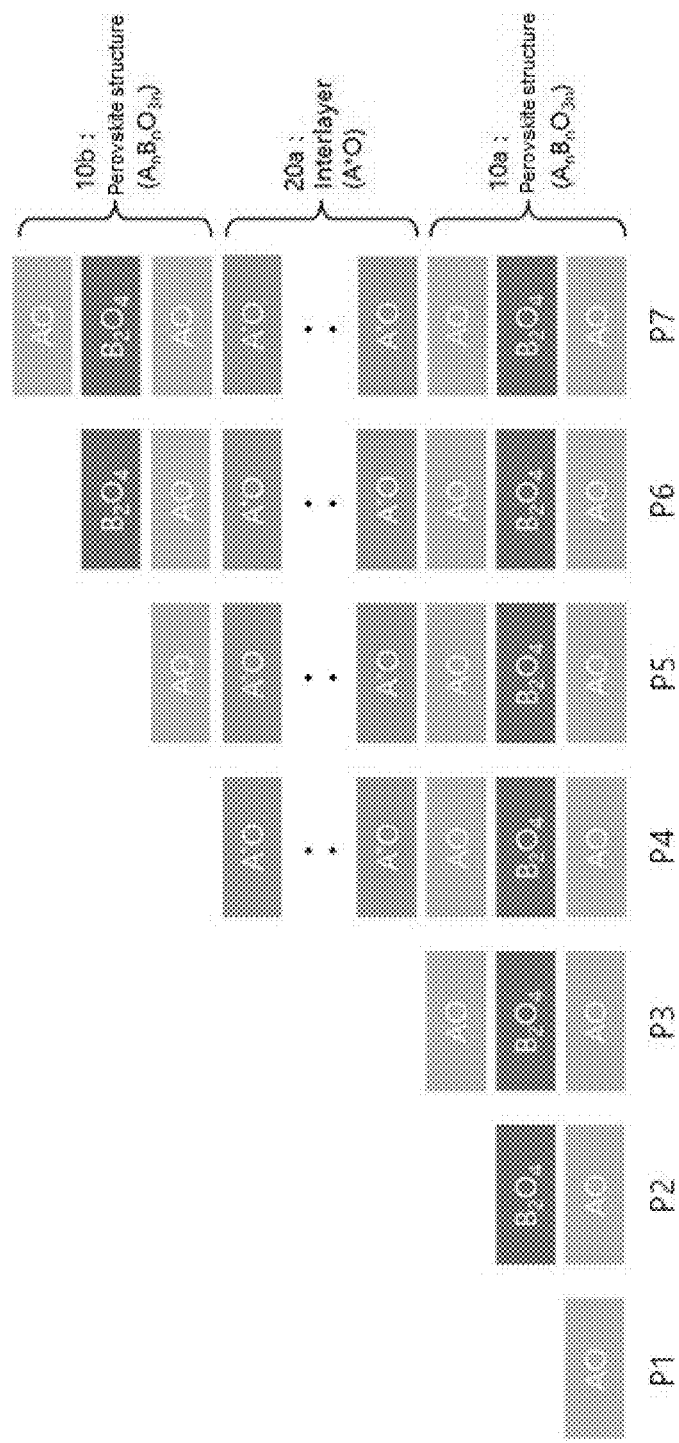

In FIG. 7, reference numerals P1 to P7 number source supplying steps at corresponding positions. Material layers formed in each of the source supplying steps P1 to P7 of FIG. 7 may be as illustrated in FIG. 8.

A configuration of the material layers in step P7 in FIG. 8 may be said to correspond to or be similar to the configuration of the piezoelectric structure described with reference to FIG. 4.

Meanwhile, in the manufacturing method of a piezoelectric structure according to an embodiment of the present disclosure, a method of including the dopant in at least one of the perovskite material layer and the interlayer may be similar to a method of doping a dopant in a general thin film manufacturing method, and a detailed description therefor will thus be omitted.

Various elements/devices based on piezoelectric properties may be implemented using the piezoelectric structures according to embodiments of the present disclosure. For example, a piezoluminescence sensor including the piezoelectric structure according to embodiments may be implemented. In addition, a display device including the piezoelectric structure according to the embodiments may also be implemented. In addition, the piezoelectric structure according to an embodiments may have a feature of emitting light with an external mechanical pressure without an electrical input signal, and may thus be applied to various application fields such as a health monitoring sensor, a ubiquitous light source, bio-imaging, stress field visualization, and artificial skin, as a piezoluminescence element.

In addition, the piezoelectric structure according to embodiments of the present disclosure may show various characteristic changes by forming an electric field only with a pressure applied thereto without the supply of power from the outside, and may thus be applied to a body-mounted wearable display field instead of solid-state lighting (SSL), which is an existing display.

For instance, the piezoelectric structure according to embodiments of the present disclosure has the reaction resistance to $CO_2$ in the atmosphere and may stably maintain a structure capable of increasing luminous efficiency, and may thus be usefully applied in the various fields described above.

According to embodiments of the present disclosure, a piezoluminescence structure/piezoelectric structure of which luminescence characteristics may be significantly changed even with a low driving pressure and which have structurally/physically excellent stability in the atmosphere may be implemented.

When the piezoluminescence structure/piezoelectric structures according to these embodiments are used, various elements/devices (for example, high-sensitivity pressure sensors) based on piezoelectric properties, having excellent stability and high sensitivity and high efficiency may be implemented.

Although exemplary embodiments of the present disclosure have been disclosed in the present specification and specific terms have been used, they are merely used in a general sense in order to easily describe technical contents of the present disclosure and assist in the understanding of the present disclosure, and are not intended to limit the scope of the present disclosure. It will be apparent to those of ordinary skill in the art that other modifications based on the technical spirit of the present disclosure may be made, in addition to embodiments disclosed herein. It may be appreciated by those skilled in the art that the piezoelectric structure, the manufacturing method thereof, and the element including the piezoelectric structure described with reference to FIGS. 1 to 8 may be variously substituted, altered, and modified without departing from the technical spirit of the present disclosure. Therefore, the scope of the present disclosure is not determined by the embodiments described above, but should be determined by the technical idea described in the claims.

The invention claimed is:

1. A piezoelectric structure comprising:
a plurality of perovskite material layers each including a material having an $A_nB_nO_{3n}$ perovskite structure; and
interlayers inserted between the plurality of perovskite material layers and including A*O which is a metal oxide having reaction resistance to $CO_2$,
wherein A is Na or K,
wherein A* is one of an alkaline earth metal element, an alkali metal element, a lanthanide element, or a post-transition metal element,
wherein B is Ir or Nb,
wherein O is an oxygen element, and
wherein n is a positive (+) integer.

2. The piezoelectric structure of claim 1, wherein the reaction resistance of A*O to $CO_2$ is higher than reaction resistance of BaO to $CO_2$.

3. The piezoelectric structure of claim 1, wherein A*O having the reaction resistance to $CO_2$ includes one of SrO and CaO.

4. The piezoelectric structure of claim 1, wherein the material having the $A_nB_nO_{3n}$ perovskite structure has a lattice parameter within a range of ±20% of a lattice parameter of A*O.

5. The piezoelectric structure of claim 1, wherein the material having the $A_nB_nO_{3n}$ perovskite structure includes any one of $NaNbO_3$ and $KNbO_3$.

6. The piezoelectric structure of claim 1, wherein the perovskite material layers and the interlayers are alternately stacked two times or more.

7. The piezoelectric structure of claim 1, wherein the interlayer is a monolayer of A*O or has a structure in which the monolayer is stacked in m layers, wherein m is a number equal to or greater than two and less than ten.

8. The piezoelectric structure of claim 1, wherein the piezoelectric structure includes a compound represented by the following Chemical Formula by a combination of the material having the $A_nB_nO_{3n}$ perovskite structure and A*O, and the compound has reaction resistance to $CO_2$, $$(AA^*)_{n+1}B_nO_{3n+1}$$  Chemical Formula:

wherein A is Na or K,
wherein A* is one of an alkaline earth metal element, an alkali metal element, a lanthanide element, or a post-transition metal element,
wherein B is Ir or Nb,
wherein O is an oxygen element, and
wherein n is a positive (+) integer.

9. The piezoelectric structure of claim 1, further comprising a dopant included in at least one of the perovskite material layer and the interlayer,
wherein the dopant includes a rare earth element or a transition metal element.

10. The piezoelectric structure of claim 9, wherein the rare earth element of the dopant includes at least one of Sm, Eu, Gd, Yb, Pr, Tm, and Er, and the transition metal element of the dopant includes at least one of Mn, Cu, Nb, and Co.

11. The piezoelectric structure of claim 1, wherein the piezoelectric structure is a piezoluminescence structure.

12. The piezoelectric structure of claim 1, wherein a driving pressure and a luminescence intensity of the piezoelectric structure are adjusted by a number and/or a content of interlayers.

13. The piezoelectric structure of claim 1, wherein a luminescence color and a luminescence intensity of the piezoelectric structure are adjusted by a trap site formed in the piezoelectric structure.

14. A piezoluminescence sensor comprising the piezoelectric structure of claim 1.

15. A display device comprising the piezoelectric structure of claim 1.

* * * * *